(12) United States Patent
Driediger

(10) Patent No.: US 7,296,210 B2
(45) Date of Patent: Nov. 13, 2007

(54) FACILITATING ERROR DETECTION FOR CONTENT ADDRESSABLE MEMORY

(75) Inventor: Steven Driediger, Kanata (CA)

(73) Assignee: Alcatel-Lucent Inc, Kanata, Ontario (CA)

( * ) Notice: Subject to any disclaimer, the term of this patent is extended or adjusted under 35 U.S.C. 154(b) by 396 days.

(21) Appl. No.: 10/663,612

(22) Filed: Sep. 16, 2003

(65) Prior Publication Data
US 2005/0060631 A1    Mar. 17, 2005

(51) Int. Cl.
*G11C 29/00* (2006.01)

(52) U.S. Cl. .................. 714/766; 714/48; 714/800; 714/807; 365/49

(58) Field of Classification Search .............. 714/763, 714/766, 768, 48, 800, 807; 711/108; 365/49
See application file for complete search history.

(56) References Cited

U.S. PATENT DOCUMENTS

| | | | | |
|---|---|---|---|---|
| 6,597,595 B1 * | 7/2003 | Ichiriu et al. | ................. | 365/49 |
| 6,914,795 B1 * | 7/2005 | Srinivasan et al. | ........... | 365/49 |
| 6,944,039 B1 * | 9/2005 | Nataraj et al. | ................. | 365/49 |
| 6,947,301 B2 * | 9/2005 | Regev et al. | .................. | 365/49 |
| 6,978,343 B1 * | 12/2005 | Ichiriu | ........................ | 711/108 |
| 7,002,823 B1 * | 2/2006 | Ichiriu | ........................ | 365/49 |

* cited by examiner

*Primary Examiner*—Guy Lamarre
*Assistant Examiner*—Esaw T. Abraham

(57) ABSTRACT

One embodiment of the disclosures made herein is an apparatus adapted to facilitate error detection for Content Addressable Memory (CAM) modules. The apparatus includes an input error detection module and an output error detection module. The input error detection module includes a parity word generator that generates a key-based parity word after receiving a key. The key-based parity word and the key jointly define a comparand that is provided to the CAM module. The output error detection module includes a protection word generator that generates a key-based protection word after receiving the key and memory. The output error detection module includes a comparator connected to the protection word generator and to the memory. The comparator enables the predetermined protection word to be compared with the key-based protection word for facilitating issuance of an output error indication when the predetermined protection word is different than the key-based protection word.

38 Claims, 2 Drawing Sheets

FACILITATING ERROR DETECTION FOR CONTENT ADDRESSABLE MEMORY

BACKGROUND OF THE INVENTION

CAM is memory that provides an address on its output bus when read. The address corresponds to the storage location of data provided at its input bus. The data (e.g., a data word) is known as a comparand or a key. Addresses in CAM are searched in parallel and produce the address storing associated data. The associated data is typically stored in separate, discrete memory in a storage location specified by the result of the CAM search. In this manner, CAM search functionality enables extremely quick searches of content.

CAM is used in ATM switches for connection identifier compression, whereby a 28-bit VPI/VCI (virtual path identifier/virtual circuit identifier) connection identifier is translated into an 18-bit connection identifier. This translation is necessary when a linecard in the switch can only support 256K connections (18-bit identifier) as compared to the 256 M connections supported by the 28-bit VPI/VCI connection identifier specified by the ATM standard.

Conventional implementations of CAM are limited in that they do not offer adequate error detection to provide indication of when an error occurs on the input bus, storage array or output bus of the CAM. Accordingly, conventional implementations of CAM are limited in their ability to facilitate data retrieval in a manner that is required by a carrier-class ATM switch. Therefore, method and equipment adapted for providing error detection in conventional implementations of CAM would be useful.

BRIEF DESCRIPTION OF THE SEVERAL VIEWS OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE INVENTION

The disclosures made herein relate to methods and apparatuses adapted for facilitating data error detection associated with conventional Content Addressable Memory (CAM) modules. Such methods and apparatuses are referred to hereinafter as disclosed CAM error detection methods and disclosed CAM error detection apparatuses, respectively, which provide corresponding disclosed CAM error detection functionality. Conventional CAM modules are defined herein to include off-the-shelf CAM modules that are not specially configured or specifically configured for facilitating error detection of a CAM module storage array, a CAM module input bus and/or a CAM module output bus.

Disclosed CAM error detection methods and disclosed CAM error detection apparatuses provide CAM error detection functionality for the CAM module storage array, the CAM module input bus and the CAM module output bus. Providing error detection on input data and output data of conventional CAM modules is more cost-effective than designing and implementing non-conventional CAM modules, particularly when means for providing such disclosed CAM error detection functionality is less costly than implementing non-conventional CAM modules.

Unlike conventional implementations of CAM error detection functionality, disclosed CAM error detection functionality enables conventional CAM modules to be used for Connection Identifier (CI) compression in a manner that meets requirements of carrier-class ATM switches. Because disclosed CAM error detection functionality enables carrier-class ATM switches to be manufactured with conventional CAM modules, which are cost-effective, switches incorporating disclosed methods and/or disclosed apparatuses are advantageous with respect to cost and performance of conventional switches. Hence, the competitiveness of ATM switches incorporating disclosed CAM error detection functionality is improved.

It will be appreciated that application of disclosed CAM error detection functionality is not limited to ATM switches. A skilled person will find that disclosed CAM error detection functionality is useful in numerous applications where reliable use of CAM storage retrieval of information is desirable and/or necessary.

Figure 1:
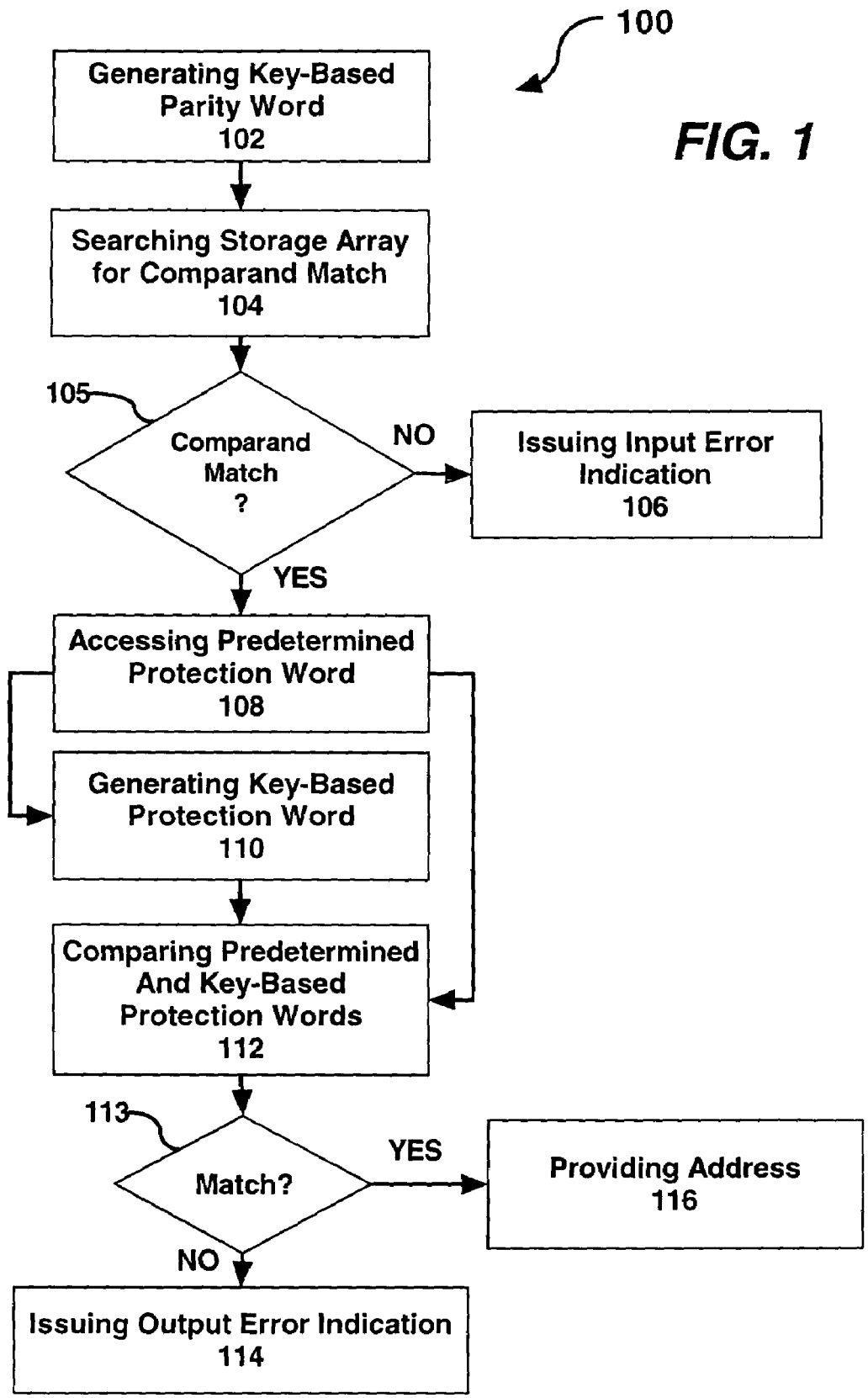
FIG. 1 depicts a method for facilitating error detection for CAM in accordance with an embodiment of the disclosures made herein.

Turning now to specific drawing figures, FIG. 1 depicts a method 100 adapted for facilitating data error detection for CAM modules in accordance with an embodiment of the disclosures made herein. An operation 102 is performed for generating a parity word based on a key (i.e., key-based parity word). The key is received from a requesting system entity. The parity word comprises one or more bits. The value of the one or more bits is a function of the key. The parity word may be obtained using known error detection techniques (e.g., cyclical redundancy check, bit interleaved parity generating, etc.) A 28-bit VPI/VCI word is an example of a basis for the key in ATM applications. The key and the key-based parity word jointly define a comparand.

After generating the key-based parity word, an operation 104 is performed for searching storage of a CAM module for an address containing data corresponding to the comparand after the comparand is provided to the CAM module. If a data error (e.g., a bit error) has occurred anywhere in the comparand, an address containing data corresponding to the comparand will not be found in the storage of the CAM module. In response to a failure in making a comparand match in the storage of the CAM module at an operation 105, an operation 106 is performed for issuing an input error indication. The input error indication means that a data error has occurred somewhere in the comparand, or that the original key was not found in the CAM.

In response to a comparand match being made in the storage of the CAM module at the operation 105, an operation 108 is performed for accessing a predetermined protection word that corresponds to the address containing data corresponding to the comparand. Searching memory including a plurality of predetermined protection words and finding the predetermined protection word is an example of accessing the predetermined protection word. In response to a comparand match being made in the storage of the CAM module or prior to searching the storage of the CAM module for the address containing data corresponding to the comparand, an operation 110 is performed for generating a protection word based on the key (i.e., key-based protection word).

After generating the key-based protection word and after the predetermined protection word is accessed, an operation 112 is performed for comparing the predetermined protection word with the key-based protection word. In response to determining that the predetermined protection word is different than the key-based protection word at an operation 113, an operation 114 is performed for facilitating (e.g., issuing) an output error indication. The output error indication means that the address from the CAM has not accessed a matching protection word in the memory and, hence, the address is corrupt. In response to determining that the predetermined protection word matches the key-based protection word at the operation 113, an operation 116 is performed for providing the address to the requesting system entity.

An input error detection process for detecting errors on an input bus on a CAM module comprises generating the key-based parity word, searching storage of the CAM module and issuing the input error indication. An output error detection process for detecting errors on an output bus of a CAM module comprises accessing the predetermined protection word, generating the protection word based on the key (i.e., key-based protection word), comparing the predetermined protection word with the key-based protection word and issuing the output error indication.

Figure 2:
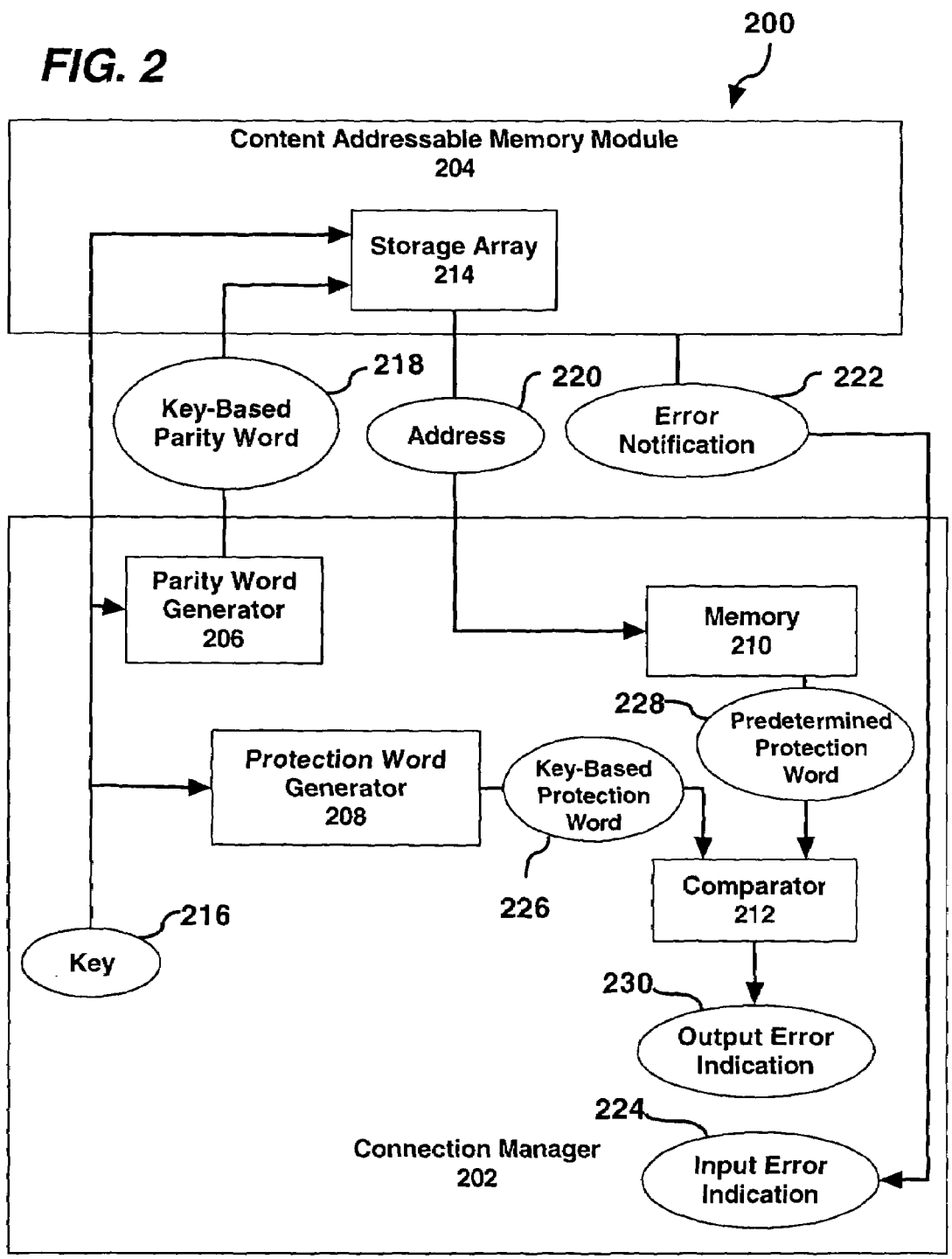
FIG. 2 depicts an apparatus adapted for facilitating error detection for CAM in accordance with an embodiment of the disclosures made herein.

FIG. 2 depicts an embodiment of an apparatus 200 capable of carrying out the method 100 of FIG. 1. An ATM switch is an example of the apparatus 200. Carrying out the method 100 via the apparatus 200 enables CAM error detection functionality in accordance with an embodiment of the disclosures made herein.

The apparatus 200 includes a Connection Manager (CM) 202 connected to a CAM module 204. The CM 202 includes a parity word generator 206, a protection word generator 208, memory 210 and a comparator 212. The CAM module 204 includes a storage array 214. The parity word generator 206 is connected to the storage array 214. The protection word generator 208 and the memory 210 are connected to inputs of the comparator 212. The memory 210 is connected between the output of the storage array 214 and one of the inputs of the comparator 212.

The parity word generator 206 is adapted for generating a parity word upon being provided a key 216 (i.e., a key-based parity word 218). The key-based parity word 218 and the key 216 jointly define a comparand, which is provided to the storage array 214 of the CAM module 204. The storage array 214 of the CAM module 204 is searched in an attempt to access an address 220 containing data that corresponds to the comparand.

An appropriate portion of the CAM module 204 (not specifically shown) provides an error notification 222 to the CM 202 if a data error (e.g., a bit error) has occurred in the comparand. A data error in the comparand prevents the address 220 containing data that corresponds to the comparand from being accessed in the storage array 214 of the CAM module 204. The error notification 222 is provided to the CM 202 for enabling an input error indication 224 to be issued. An input error detection module comprises the parity word generator 206 and means (not specifically shown) of the CM 202 adapted for issuing the input error indication 224.

The protection word generator 208 generates a protection word from the key 216 (i.e., a key-based protection word 226). A device capable of generating a cyclical redundancy code or a bit interleaved parity word is an example of the protection word generator 208. A plurality of predetermined protection words (e.g., 4 bit protection words) is stored in the memory 210 of the CM 202. When the address 220 containing data that corresponds to the comparand is accessed in the storage array 214 of the CAM module 204, the memory 210 of the CM 202 is searched for accessing a predetermined protection word 228 corresponding to the address 220 assessed from the storage array 214 of the CAM module 204.

The comparator 212 compares the key-based protection word 226 with the predetermined protection word 228. When the key-based protection word 226 is different than predetermined protection word 228 (i.e., when inputs of the comparator 208 are not equal), the address 220 from the CAM module 204 has not accessed a matching predetermined protection word in the memory 210. Hence, the address 220 is corrupt and the comparator 212 facilitates issuance of an output error indication 230.

An input error detection module capable of detecting errors on an input bus on a CAM module comprises the parity word generator 206 and means (not shown) of the CM 202 adapted for issuing the input error indication 224. An output error detection module capable of detecting errors on an output bus on a CAM module comprises the protection word generator 208, the memory 210 and the comparator 212.

A data processor program in accordance with an embodiment of the disclosures made herein controls at least a portion of the operations associated with facilitating disclosed CAM error detection functionality. Such a data processor program is processible by a data processor of an apparatus in accordance with an embodiment of the disclosures made herein for carrying out operations of a method in accordance with an embodiment of the disclosures made herein. Furthermore, such a data processor program may be resident on one or more data processing modules (e.g. a card including the data processor) or may be accessible by the data processor from an apparatus such as a diskette, a compact disk, a network storage device, a component of the network system or other suitable apparatus. The term data processor program refers to computer software, data processor algorithms or any other type of/sets of instruction code capable of controlling operations associated with a data processor.

A microprocessor, an application specific integrated circuit (ASIC), a field-programmable gate array (FPGA) and other types of programmable logic devices (PLDs) are examples of data processors capable of facilitating disclosed CAM error detection functionality. For example, it is contemplated herein that a FPGA may be used to generate parity and protection words, with appropriate software being used to configure the FPGA appropriately and to report any detected errors.

A data processor program accessible from an apparatus by a data processor is defined herein as a data processor program product. A read-only memory (ROM), a programmable read-only memory (PROM), an erasable programmable read-only memory (EPROM), an electrically erasable programmable read-only memory (EEPROM), an electrically alterable programmable read-only memory (EAPROM), a flash memory, other non-volatile memory (NVM), a compact disk (CD/CDR/CDRW), or a digital video disk (DVD/DVDR/DVDRW) having a data processor program adapted for carrying out disclosed CAM error detection functionality are examples of a data processor program product.

In the preceding detailed description, reference has been made to the accompanying drawings that form a part hereof, and in which are shown by way of illustration specific embodiments in which the invention may be practiced. These embodiments have been described in sufficient detail to enable those skilled in the art to practice the invention, and it is to be understood that other embodiments may be utilized and that logical, mechanical, chemical and electrical changes may be made without departing from the spirit or scope of the invention. To avoid detail not necessary to enable those skilled in the art to practice the invention, the description omits certain information known to those of skill in the art. The preceding detailed description is, therefore, not to be taken in a limiting sense, and the scope of the present invention is defined only by the appended claims.

What is claimed is:

1. A method for detecting data errors associated with a Content Addressable Memory (CAM) module, comprising:
   generating a key-based parity word and a key-based protection word after receiving a key, wherein the key-based parity word and the key jointly define a comparand;
   accessing a predetermined protection word corresponding to an address of a CAM module that contains data corresponding to the comparand in response to receiving the address from the CAM module; and
   comparing the predetermined protection word with the key-based protection word for facilitating issuance of an output error indication when the predetermined protection word is different than the key-based protection word.

2. The method of claim 1 wherein the key includes a 28-bit connection identifier.

3. The method of claim 1, further comprising:
   providing the comparand to the CAM module; and
   searching storage of the CAM module for the address that contains said data corresponding to the comparand.

4. The method of claim 1 wherein generating the key-based protection word includes generating a cyclical redundancy code.

5. The method of claim 1 wherein generating the key-based protection word includes generating a bit interleaved parity word.

6. The method of claim 1 wherein:
   generating the key-based parity word is performed by a parity word generator of an input protection module; and
   generating the key-based protection word is performed by a protection word generator of an output protection module.

7. The method of claim 6, further comprising:
   storing a plurality of predetermined protection words in memory of the output protection module; and
   wherein accessing the predetermined protection word includes searching said memory of the output protection module.

8. The method of claim 7 wherein comparing is performed by a comparator of the output protection module.

9. The method of claim 7, further comprising:
   searching storage of the CAM module for the address containing data corresponding to the comparand;
   providing the address to the output protection module in response to the address containing data corresponding to the comparand being identified in said storage; and
   wherein accessing the predetermined protection word is performed after providing the address to the output protection module.

10. The method of claim 7, further comprising:
    receiving an input error notification at an apparatus comprising at least one of the input error detection module and the output error detection module in response to failing to find the address corresponding to comparand in said storage, wherein the input error indication is provided by the CAM module to the apparatus.

11. The method of claim 1, further comprising:
    issuing the output error indication in response to said comparing resulting in a determination that the predetermined protection word is different than the key-based protection word.

12. A method for detecting data errors associated with a Content Addressable Memory (CAM) module, comprising:
    generating a key-based parity word and a key-based protection word after receiving a key at an input error detection module, wherein the key-based parity word and the key jointly define a comparand;
    providing the comparand to a CAM module;
    searching storage of the CAM module for an address containing data corresponding to the comparand;
    providing the address to an output error detection module;
    accessing a predetermined protection word corresponding to the address in response to receiving the address from the CAM module, wherein the predetermined protection word is stored in memory of the output error detection module; and
    comparing the predetermined protection word with the key-based protection word for determining whether the predetermined protection word is the same as the key-based protection word.

13. The method of claim 12, further comprising:
    issuing an output error indication when the predetermined protection word is different than the key-based protection word.

14. The method of claim 12, further comprising:
    receiving an input error indication at an apparatus comprising at least one of the input error detection module and the output error detection module in response to failing to find the address corresponding to comparand in said storage of the CAM module.

15. The method of claim 14 wherein the input error indication is provided by the CAM module to the apparatus comprising at least one of the input error detection module and the output error detection module.

16. An apparatus adapted for detecting data errors associated with a Content Addressable Memory (CAM) module, comprising:
    an input error detection module adapted for generating a key-based parity word after receiving a key, wherein the key-based parity word and the key jointly define a comparand that is provided to a CAM module; and
    an output error detection module connected to the input error detection module, adapted for generating a key-based protection word after receiving the key and adapted for accessing a predetermined protection word corresponding to an address of a CAM module that contains data corresponding to the comparand in response to receiving the address from the CAM module.

17. The apparatus of claim 16 wherein:
    the input protection module includes a parity word generator; and
    the parity word generator performs generating the key-based parity word.

18. The apparatus of claim 17 wherein:
    the parity word generator is adapted for generating cyclical redundancy codes; and
    the key-based parity word is a cyclical redundancy code.

19. The apparatus of claim 17 wherein:
    the parity word generator is adapted for generating bit interleaved parity codes; and the key-based parity word is a bit interleaved parity code.

20. The apparatus of claim 16 wherein:
the input error detection module is connected to the CAM module; and
the input error detection module provides the comparand to the CAM module.

21. The apparatus of claim 16 wherein the output error detection module includes:
the output error detection module includes a protection word generator; and
the parity word generator performs generating the key-based protection word.

22. The apparatus of claim 21 wherein:
the output error detection module includes memory having a plurality of predetermined protection words stored therein; and
the predetermined protection word corresponding to the address of the CAM module that contains data corresponding to the comparand is accessed from said memory.

23. The apparatus of claim 22 wherein the output error detection module includes a comparator connected to the protection word generator and to said memory for enabling the predetermined protection word to be compared with the key-based protection word for facilitating issuance of an output error indication when the predetermined protection word is different than the key-based protection word.

24. The apparatus of claim 23 wherein the output error detection module is further adapted for issuing the output error indication in response to said comparing resulting in a determination that the predetermined protection word is different than the key-based protection word.

25. The apparatus of claim 16 wherein the output error detection module is further adapted for comparing the predetermined protection word with the key-based protection word for facilitating issuance of an output error indication when the predetermined protection word is different than the key-based protection word.

26. The apparatus of claim 16 further comprising:
means for receiving an input error indication provided by the CAM module in response to failing to find the address corresponding to comparand in storage of the CAM module.

27. An apparatus adapted for detecting data errors associated with a Content Addressable Memory (CAM) module, comprising:
means for generating a key-based parity word, wherein the key-based parity word and the key jointly define a comparand;
means for receiving an input error indication provided by the CAM module in response to failing to find the address corresponding to comparand in storage of the CAM module;
means for enabling a predetermined protection word corresponding to an address of a CAM module that contains data corresponding to the comparand to be accessed in response to receiving the address from the CAM module;
means for generating a key-based protection word; and
means for comparing the predetermined protection word with the key-based protection word for facilitating issuance of an output error indication when the predetermined protection word is different than the key-based protection word.

28. An apparatus adapted for detecting data errors associated with a Content Addressable Memory (CAM) module, comprising:
a CAM module;
a connection manager connected to the CAM module, wherein the connection manager includes a data processor; and
a data processor program processable by the data processor, wherein the data processor program is adapted for enabling the data processor to facilitate:
generating a key-based parity word and a key-based protection word after receiving a key, wherein the key-based parity word and the key jointly define a comparand;
accessing a predetermined protection word corresponding to an address of the CAM module that contains data corresponding to the comparand in response to receiving the address from the CAM module; and
comparing the predetermined protection word with the key-based protection word for facilitating issuance of an output error indication when the predetermined protection word is different than the key-based protection word.

29. The apparatus of claim 28 wherein the key includes a 28-bit connection identifier.

30. The apparatus of claim 28 wherein the data processor program is further adapted for enabling the data processor to facilitate:
providing the comparand to the CAM module; and
searching storage of the CAM module for the address that contains said data corresponding to the comparand.

31. The apparatus of claim 28 wherein enabling the data processor to facilitate generating the key-based protection word includes enabling the data processor to facilitate generating a cyclical redundancy code.

32. The apparatus of claim 28 wherein enabling the data processor to facilitate generating the key-based protection word includes enabling the data processor to facilitate generating a bit interleaved parity word.

33. The apparatus of claim 28 wherein:
generating the key-based parity word is performed by a parity word generator of an input protection module; and
generating the key-based protection word is performed by a protection word generator of an output error detection module.

34. The apparatus of claim 33 wherein:
the data processor program is further adapted for enabling the data processor to facilitate storing a plurality of predetermined protection words in memory of the output error detection module; and
enabling the data processor to facilitate accessing the predetermined protection word includes enabling the data processor to facilitate searching said memory of the output error detection module.

35. The apparatus of claim 34 wherein comparing is performed by a comparator of the output error detection module.

36. The apparatus of claim 34 wherein the data processor program is further adapted for enabling the data processor to facilitate:
searching storage of the CAM module for the address containing data corresponding to the comparand; and
providing the address to the output error detection module in response to the address containing data corresponding to the comparand being identified in said storage;

wherein accessing the predetermined protection word is performed after providing the address to the output error detection module.

37. The apparatus of claim 34 wherein the data processor program is further adapted for enabling the data processor to facilitate:

receiving an input error notification at an apparatus comprising at least one of the input error detection module and the output error detection module in response to failing to find the address corresponding to comparand in said storage, wherein the input error indication is provided by the CAM module to the apparatus comprising at least one of the input error detection module and the output error detection module.

38. The apparatus of claim 28 wherein the data processor program is further adapted for enabling the data processor to facilitate:

issuing the output error indication in response to said comparing resulting in a determination that the predetermined protection word is different than the key-based protection word.

* * * * *